United States Patent
Tuan et al.

(10) Patent No.: US 7,253,661 B1
(45) Date of Patent: Aug. 7, 2007

(54) METHOD AND APPARATUS FOR A CONFIGURABLE LATCH

(75) Inventors: Tim Tuan, San Jose, CA (US); Sean W. Kao, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 231 days.

(21) Appl. No.: 11/145,135

(22) Filed: Jun. 3, 2005

(51) Int. Cl.
*G06F 7/38* (2006.01)
*H03K 3/00* (2006.01)

(52) U.S. Cl. .................. 326/46; 327/166; 327/219

(58) Field of Classification Search .............. 326/37, 326/38, 46; 327/164, 165, 166, 215, 219
See application file for complete search history.

(56) References Cited

U.S. PATENT DOCUMENTS 7,088,136 B1 * 8/2006 Lewis ..................... 326/46

OTHER PUBLICATIONS

Horenstein, "Microelectronic circuits and devices", 1990, Prentice-Hall, Inc., p. 754.*

* cited by examiner

*Primary Examiner*—Daniel Chang
(74) *Attorney, Agent, or Firm*—LeRoy D. Maunu; Lois D. Cartier

(57) ABSTRACT

A configurable latch is implemented using a configurable pulse generator and a level sensitive (LS) latch. The configurable pulse generator produces either a pulse signal that is aligned with the input clock edge, or simply provides the input clock signal to its output in response to a pulse generator control signal. If a pulse signal is provided to the latch, then edge triggered (ET) latch operation is effected within the latch. If, on the other hand, a clock signal is provided to the latch, then LS latch operation is effected within the latch. Thus, configuration of latch operation is established in response to the type of clock signal that is provided to the latch.

18 Claims, 10 Drawing Sheets

US 7,253,661 B1

METHOD AND APPARATUS FOR A CONFIGURABLE LATCH

FIELD OF THE INVENTION

The present invention generally relates to latches, and more particularly to an area efficient configurable latch using a pulse-triggered topology.

BACKGROUND

Modern digital circuits, whether implemented in integrated circuits (IC) or in discrete form, often utilize data latches. Two of the most common types of data latches in use today are the level-sensitive (LS) latch and the edge-triggered (ET) latch.

The logic output of an LS latch generally depends upon the activity of the clock signal that is present at its clock input pin. In particular, the output logic state of the LS latch reflects the logic state present at its input pin during a portion of the input clock cycle. In this phase of operation, the latch becomes transparent and passes logic values present at its input directly to its output. In a second phase of operation, the LS latch maintains its output at a fixed logic level during the remaining portion of the input clock cycle.

Prior art implementations of ET latches have included a combination of two LS latches. The first LS latch is transparent during a first phase of the input clock, while the second LS latch is transparent during a second phase of the input clock. The combined behavior is such that the input data is captured and passed to the output only when the clock signal exhibits a low-to-high logic transition. Conversely, the configuration of the two LS latches may be altered to capture input data during a high-to-low logic transition.

A latch may be implemented such that its operation is configurable. That is, transmission gates may be inserted into an ET latch, such that when configured as an LS latch, the transmission gates disable the second LS latch leaving only the first LS latch active. When configured as an ET latch, the transmission gates have no effect, leaving both LS latches active. In alternative LS latch configurations, the first LS latch stage may be deactivated, leaving only the second LS latch active.

In IC implementations, however, latches are often used in large numbers. Accordingly, a significant amount of semiconductor die area must be reserved for latch implementation. The amount of semiconductor die area that must be reserved generally increases in linear proportion to the number of latches implemented. Similarly, the amount of power consumed by these latch implementations generally increases in linear proportion to the number of latches implemented.

SUMMARY

To overcome limitations in the prior art, and to overcome other limitations that will become apparent upon reading and understanding the present specification, the present invention includes an apparatus and method for configuring an LS latch for use as an LS, or an ET, latch using a clock signal. Such an implementation resulting in a reduction of the number of components required to implement the latch.

In accordance with one embodiment of the invention, a configurable latch comprises a pulse generator that is coupled to receive a clock input signal and a pulse mode signal. The pulse generator is adapted to provide a clock output signal having a programmable duty cycle in response to a logic level of the pulse mode signal. The configurable latch further comprises a level sensitive (LS) latch that is coupled to receive the clock output signal. The level sensitive latch is adapted to operate as an edge triggered (ET) latch in response to a first duty cycle of the clock output signal and is adapted to operate as an LS latch in response to a second duty cycle of the clock output signal.

In accordance with another embodiment of the invention, a configurable latch bank comprises a pulse generator that is coupled to receive a clock signal and is adapted to pass the clock signal in response to a signal that indicates a clock mode of operation and is adapted to generate a variable width pulse signal from the clock signal in response to a signal that indicates a pulse mode of operation. The configurable latch bank further comprises a plurality of level sensitive (LS) latches that are coupled to the pulse generator and are adapted to operate as LS latches in response to receiving the clock signal and are adapted to operate as edge triggered (ET) latches in response to receiving the variable width pulse signal. The pulse generator includes a reset circuit that is coupled to receive a reset signal and a corresponding reset value for each of the plurality of LS latches, the reset circuit being adapted to drive an output of each of the plurality of LS latches to the corresponding reset value in response to a first state of the reset signal.

In accordance with another embodiment of the invention, a method of operating a configurable latch comprises providing a clock signal having a programmable pulse width to a single-stage, level sensitive (LS) latch and programming the clock signal to have first and second pulse widths, where the first pulse width is wider than the second pulse width. The LS latch operates as an LS latch in response to the first pulse width and the LS latch operates as an edge triggered (ET) latch in response to the second pulse width.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
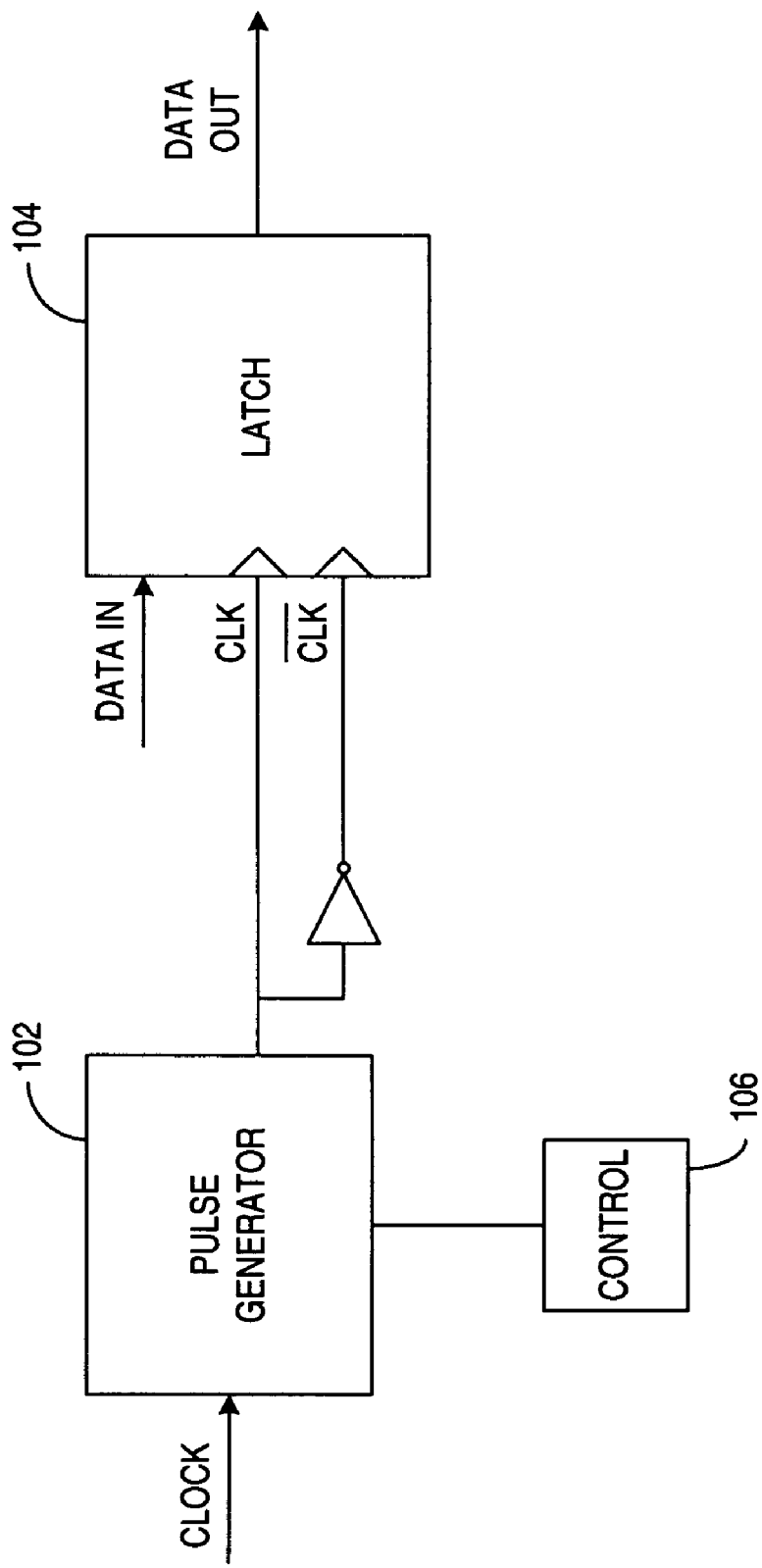
FIG. 1 illustrates a high level block diagram of a configurable latch in accordance with various embodiments of the present invention.

The various embodiments of the present invention provide a configurable latch that may be implemented using a configurable pulse generator and an LS latch. The configurable pulse generator produces either a configurable width pulse signal that is aligned with the input clock edge, or simply provides the input clock signal to its output. If a pulse signal is provided to the latch, then ET latch operation is effected within the latch, since the latch is transparent only when the pulse signal is high, which is a very short amount of time. If, on the other hand, the input clock signal is provided to the latch, then LS latch operation is effected within the latch. Thus, latch operation is programmed as a function of the duty cycle of the clock signal received by the latch.

In particular, the input clock signal generally operates at a 50% duty cycle, such that the logic level of the input clock signal is at a logic high value for half of the period of the input clock signal. The pulse signal, however, is generated with a duty cycle having a decreased duty cycle, such that the duration of the logic high value of the input clock signal is much shorter than the period of the input clock signal.

In one embodiment of the invention, a single pulse generator may control the operation of a number of latches. As such, a bank of latches that are slaved to the pulse generator may each behave as an LS latch or an ET latch as discussed above. In addition, an embodiment of the present invention contemplates inclusion of reset capability and clock enable capability within the pulse generator itself. Thus, once the reset signal is activated within the pulse generator, each latch that is slaved to the pulse generator also resets to a configurable reset value.

One embodiment of present invention additionally provides fairly substantial semiconductor die area savings, especially when a number of latches are slaved to a single pulse generator. In particular, a typical ET latch implementation essentially cascades two LS latches via a transmission gate. In this embodiment of present invention, however, only a single LS latch is needed to provide both LS and ET functionality; thus, the second LS stage may be removed. Sharing the pulse generator across eight LS latches, for example, provides a semiconductor die area savings that is substantially equivalent to the amount of semiconductor die area that is required to implement eight LS latch stages.

Thus, one application where significant semiconductor die area savings may be realized is an integrated circuit (IC), of which programmable logic devices (PLD) are a subset. PLDs are a well-known type of IC that may be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In some CPLDs, configuration data is stored on-chip in non-volatile memory. In other CPLDs, configuration data is stored off-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

FIG. 1 exemplifies a block diagram of a configurable latch in accordance with various embodiments of the present invention, whose operation within a PLD, for example, may be controlled by control block 106. Control block 106 may be implemented via any number of static, or non-volatile, means as discussed above to control the operation of pulse generator 102. In a first mode of operation, for example, control 106 may configure pulse generator 102 to produce a pulse signal whose rising edge is aligned with the rising edge of signal CLOCK.

The falling edge of the pulse signal generated by pulse generator 102 may also be programmable via control 106, such that the pulse width of the pulse signal may be programmed as necessary to elicit proper operation of latch 104. In one embodiment, for example, programming a narrow pulse width of the pulse signal elicits ET functionality from latch 104, since latch 104 is transparent only when the pulse signal is at a logic high value. Across temperature, voltage, and process variation, however, latch 104 may require a slightly wider, or narrower, pulse width to achieve proper operation. Thus, control 106 may be used to programmably set the pulse width of the pulse signal such that proper operation of latch 104 is virtually guaranteed.

In another embodiment, control 106 may be set such that signal CLOCK is essentially gated through pulse generator 102, to substantially provide the input signal, CLOCK, as the output clock signal, CLK. In such an instance, latch 104 operates as an LS latch, whereby in the absence of signal CLK, signal DATA OUT maintains its previously programmed value. Once signal CLK becomes active, latch 104 becomes transparent to provide signal DATA IN as signal DATA OUT when signal CLK is a logic high value. Conversely, latch 104 maintains its output state when signal CLK is at a logic low value.

Figure 2:
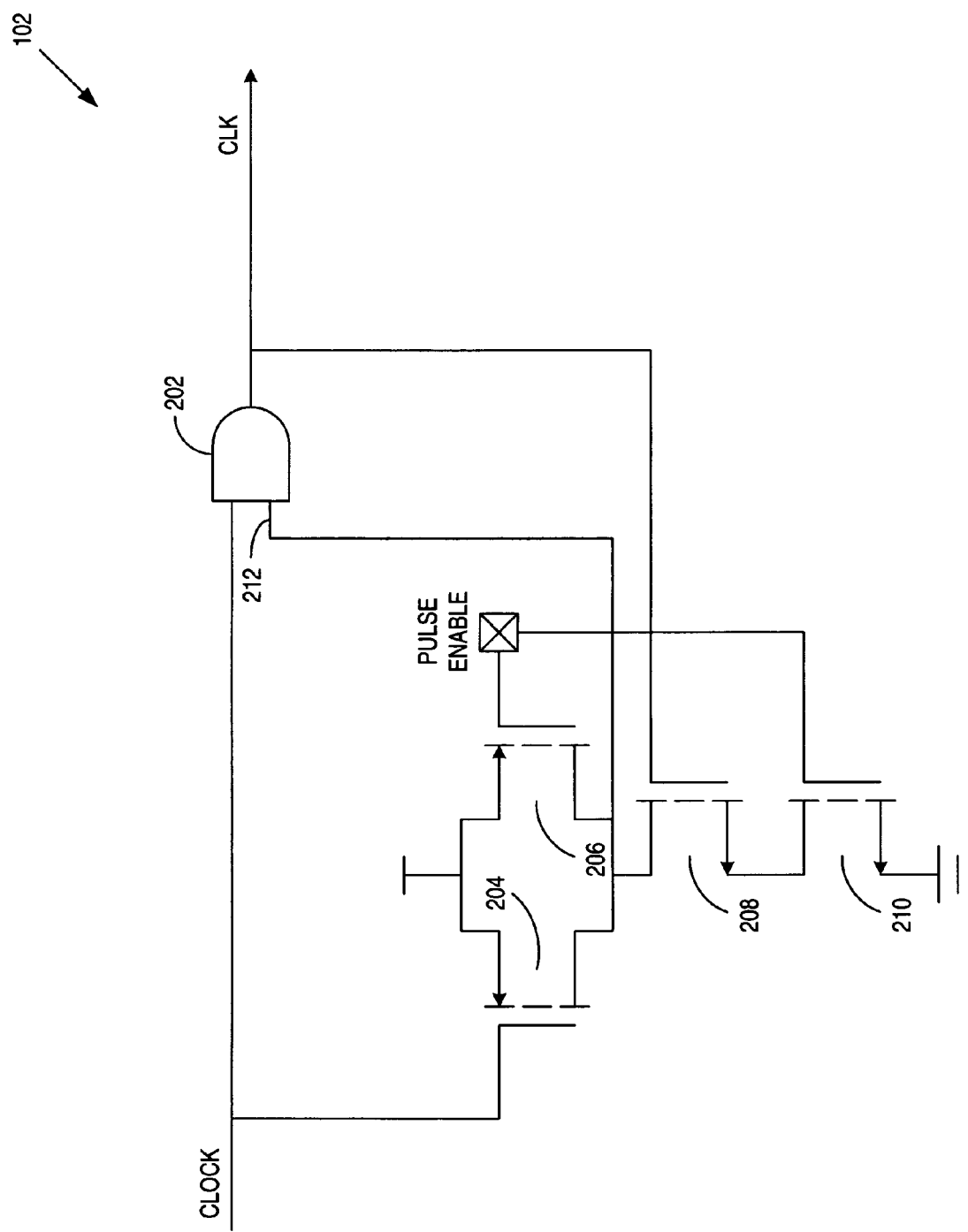
FIG. 2 illustrates a schematic diagram of the pulse generator of FIG. 1.

Turning to FIG. 2, an exemplary schematic diagram of pulse generator 102 of FIG. 1 is illustrated. A pulse mode signal, for example, signal PULSE ENABLE may be provided by control block 106 as, for example, a memory cell input from a PLD, a static RAM memory block contained within the PLD, or any other volatile, or non-volatile, memory location.

P-type Field Effect Transistors (PFET) 204 and 206 are connected in parallel, whereby their respective source terminals are commonly connected to the top rail power supply, while their respective drain terminals are commonly connected to one input of AND gate 202 at node 212 and the drain terminal of N-type FET (NFET) 208. The drain terminal of NFET 210 is connected to the source terminal of NFET 208 and the gate terminals of FETs 206 and 210 are each connected to signal PULSE ENABLE. The other input to AND gate 202 is connected to signal CLOCK, while the output of AND gate 202 is connected to the gate terminal of NFET 208.

In response to signal PULSE ENABLE, pulse generator 102 may simply act as a clock buffer, such that signal CLOCK is passed through AND gate 202 as signal CLK to implement "clock mode". Conversely, pulse generator 102 may generate a pulse at signal CLK, in response to the rising edge of signal CLOCK to implement "pulse mode".

In clock mode, signal PULSE ENABLE is at a logic low, thus rendering NFET 210 non-conductive and PFET 206 conductive. Node 212 is pulled up to a logic high, which effectively renders AND gate 202 as a buffer for signal CLOCK. That is to say, for example, that when signal CLOCK is at a logic low value, signal CLK is also at a logic low value. Similarly, when signal CLOCK is at a logic high value, signal CLK is also at a logic high value.

In pulse mode, signal PULSE ENABLE is at a logic high value, which renders NFET 210 conductive and PFET 206 non-conductive. When signal CLOCK is at a logic low value, PFET 204 is rendered conductive, thus pulling node 212 up to a logic high value. The output of AND gate 202 (signal CLK) remains at a logic low value.

Once signal CLOCK transitions to a logic high value, the output of AND gate 202 (signal CLK) also transitions to a logic high value, thus rendering NFET 208 conductive. For a brief moment, signal CLK remains at a logic high value, but since NFETs 208-210 are both conductive, node 212 is discharged and eventually pulled down to a logic low value, which causes the output of AND gate 202 (signal CLK) to transition to a logic low value. Thus, the rising edge of signal CLK is incident to the rising edge of signal CLOCK. The duration of the logic high state of signal CLK is approximately equal to the sum of the discharge time of node 212 and the propagation delay time through AND gate 202.

Thus, it can be seen that transistor pairs 204,206 and 208,210 combine with signal PULSE ENABLE to comprise a gating circuit. The gating circuit provides a gating signal to AND gate 202 to gate signal CLOCK in accordance with the particular mode of operation. During clock mode, the gating circuit is effective to render AND gate 202 as a clock buffer (by setting node 212 to a logic high value), thereby allowing signal CLOCK to pass unabated.

During pulse mode, the gating circuit initially allows signal CLOCK to pass as signal CLK, but after some amount of time during the first half cycle of signal CLOCK, the gating circuit is effective through feedback to pull node 212 to a logic low value. As discussed in more detail below, a delay block may be used in the feedback path of the gating circuit to lengthen the amount of time that node 212 is allowed to remain at a logic high value. Thus, pulse generator 102 is operative to provide signal CLK having a programmable duty cycle in response to signal PULSE ENABLE. In particular, signal CLK assumes the duty cycle of signal CLOCK while in the "clock mode" of operation. Conversely, signal CLK is programmed to exhibit a much shorter duty cycle while in the "pulse mode" of operation.

Figure 3:
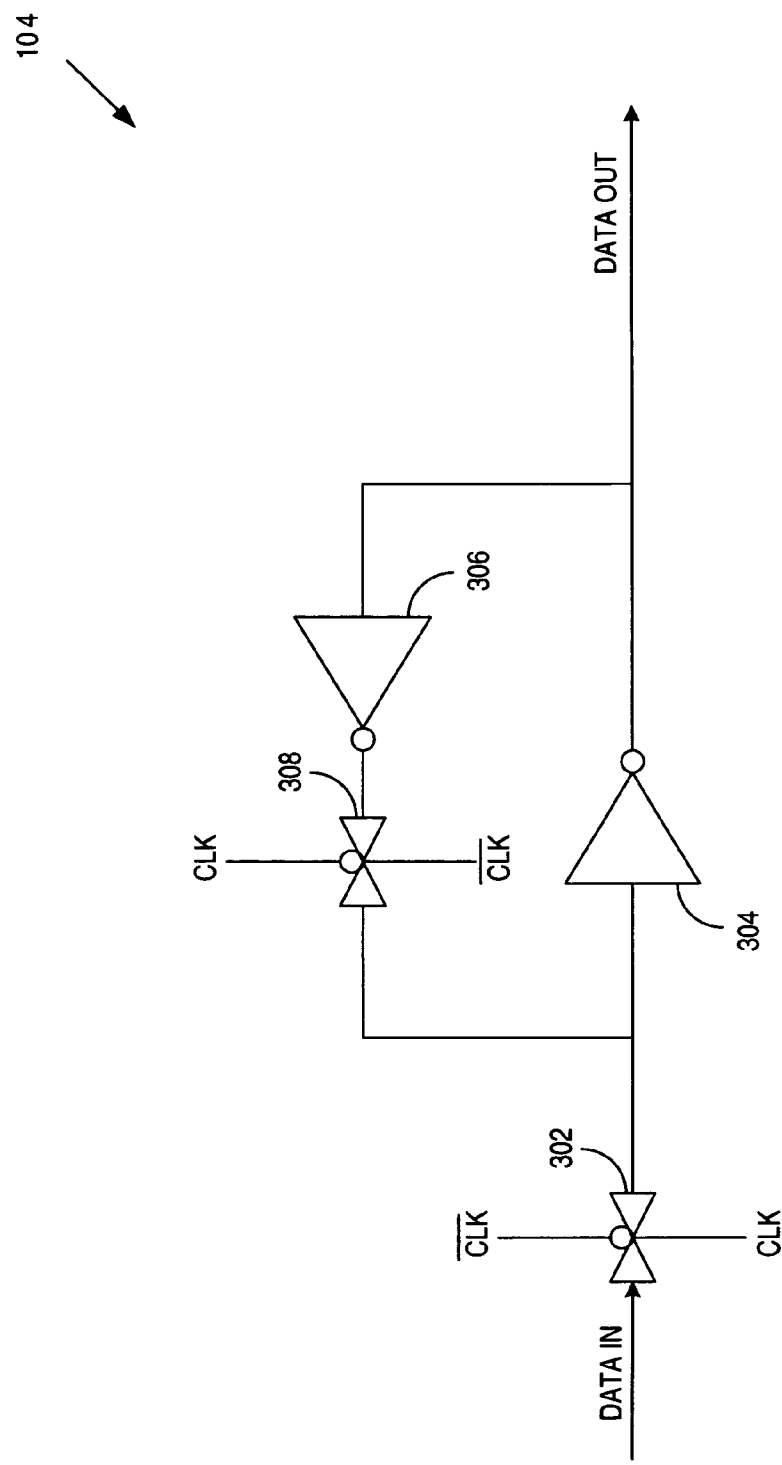
FIG. 3 illustrates a schematic diagram of the latch of FIG. 1.

Turning to FIG. 3, an exemplary schematic diagram of LS latch 104 of FIG. 1 is illustrated. Signal DATA IN is received by transmission gate 302, which also receives both phases of signal CLK from pulse generator 102 of FIG. 1 as shown. The output of transmission gate 302 is connected to the input of inverter 304 as well as the output of transmission gate 308. Transmission gate 308 also receives both phases of signal CLK as shown. The output of inverter is connected to the input of inverter 306, which also forms output signal DATA OUT.

In operation, LS latch 104 receives both phases of signal CLK, which is provided by pulse generator 102 of FIG. 1. LS latch 104 operates as an LS latch when pulse generator 102 is operating in clock mode, and LS latch 104 operates as an ET latch, when pulse generator 102 is operating in pulse mode. In clock mode, LS latch 104 is transparent when signal CLK is at a logic high value, i.e., transmission gate 302 is conductive and signal DATA OUT reflects the inverted state of signal DATA IN while signal CLK remains at a logic high value. Once signal CLK transitions to a logic low value, transmission gate 302 blocks signal DATA IN, and signal DATA OUT reflects the inverted state of DATA IN just prior to the transition of signal CLK. Transmission gate 308 activates the feedback path to latch signal DATA OUT until signal CLK transitions back to a logic high value.

In pulse mode, since signal CLK is at a logic low value most of the time, signal DATA OUT remains latched at its previous state most of the time. Signal DATA OUT is only allowed to reflect the inverted state of signal DATA IN during the brief duration that signal CLK is at a logic high value. Thus, an ET mode of operation is facilitated, since signal DATA OUT is only allowed to toggle in relation to the rising edge of signal CLK.

Figure 4:
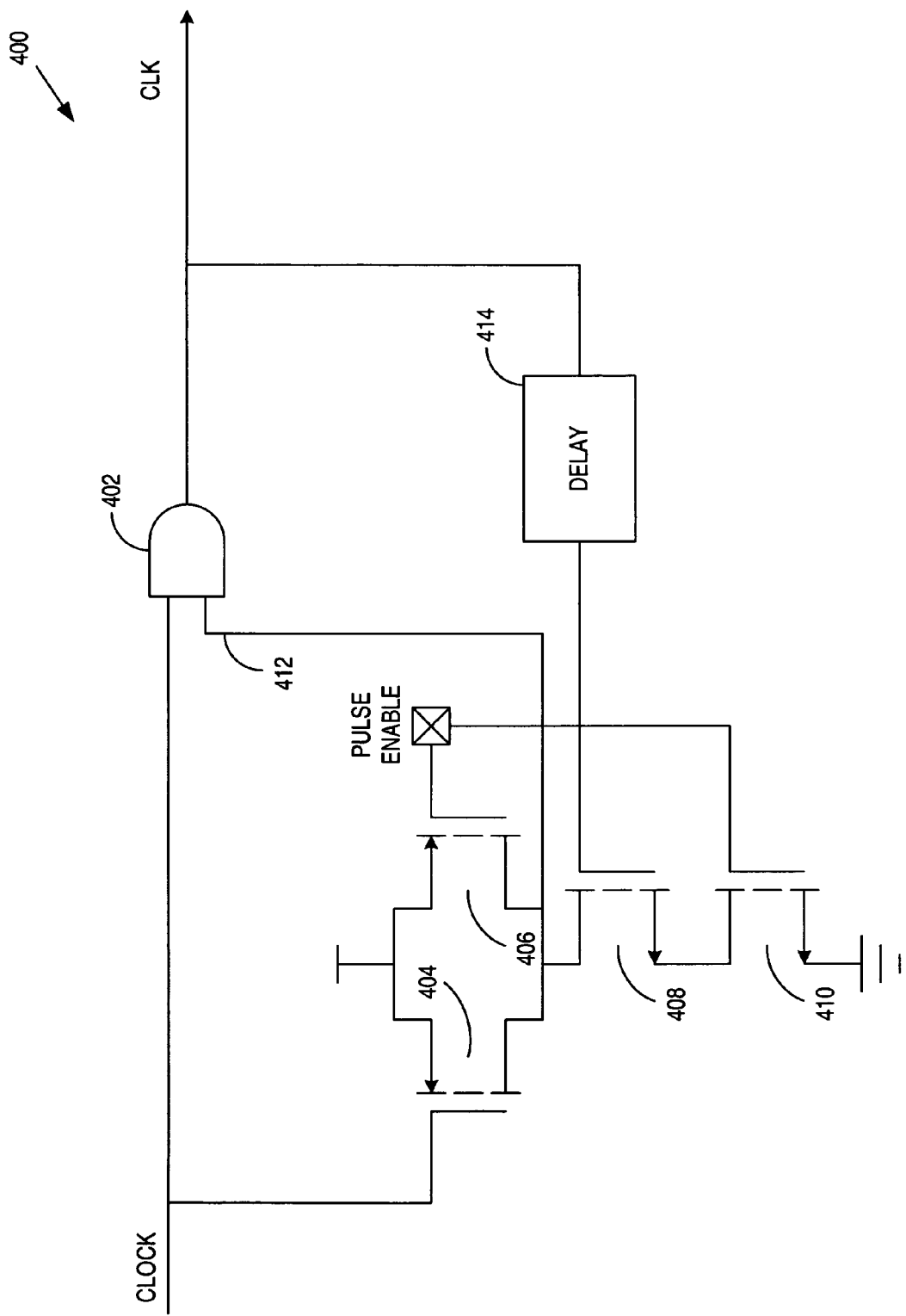
FIG. 4 illustrates an alternative embodiment of the pulse generator of FIG. 1.

Turning to FIG. 4, schematic diagram 400 exemplifies an alternative embodiment of pulse generator 102 of FIG. 1. Signal PULSE ENABLE may be provided by control block 106 as, for example, a memory cell input from a PLD, a static RAM memory block contained within the PLD, or any other volatile, or non-volatile, memory location.

PFET 404 and 406 are connected in parallel, whereby their respective source terminals are commonly connected to the top rail power supply, while their respective drain terminals are commonly connected to one input of AND gate 402 at node 412 and the drain terminal of NFET 408. The drain terminal of NFET 410 is connected to the source terminal of NFET 408 and the gate terminals of FETs 406 and 410 are each connected to signal PULSE ENABLE. The other input to AND gate 402 is connected to signal CLOCK, while the output of AND gate 402 is connected to the gate terminal of NFET 408.

In response to signal PULSE ENABLE, pulse generator 400 may simply act as a buffer, such that signal CLOCK is passed through AND gate 402 as signal CLK to implement "clock mode". Conversely, pulse generator 400 may generate a pulse at signal CLK, in response to the rising edge of signal CLOCK to implement "pulse mode".

In clock mode, signal PULSE ENABLE is at a logic low, thus rendering NFET 410 non-conductive and PFET 406 conductive. Node 412 is pulled up to a logic high, which effectively renders AND gate 402 as a buffer for signal CLOCK. That is to say, for example, that when signal CLOCK is at a logic low value, signal CLK is also at a logic low value. Similarly, when signal CLOCK is at a logic high value, signal CLK is also at a logic high value.

In pulse mode, signal PULSE ENABLE is at a logic high value, which renders NFET 410 conductive and PFET 406 non-conductive. When signal CLOCK is at a logic low value, PFET 404 is rendered conductive, thus pulling node 412 up to a logic high value. The output of AND gate 402 (signal CLK) remains at a logic low value.

Once signal CLOCK transitions to a logic high value, the output of AND gate 402 (signal CLK) also transitions to a logic high value. After an amount of time equal to the delay of delay block 414, delay, NFET 408 is rendered conductive. Signal CLK remains at a logic high value, but since NFETs 408-410 are both conductive, node 412 is discharged and eventually pulled down to a logic low value, which causes the output of AND gate 402 (signal CLK) to transition to a logic low value. Thus, the rising edge of signal CLK is incident to the rising edge of signal CLOCK. The duration of the logic high state of signal CLK is approximately equal to the sum of $\tau_{delay}$, the discharge time of node 412, and the propagation delay time through AND gate 402.

It can be seen, therefore, that the pulse width of pulse generator 400 differs from the pulse width of pulse generator 102 by an amount equal to delay. In particular, the pulse width of pulse generator 400 is wider by an amount equal to $\tau_{delay}$. Any number of techniques may be used to generate the delay of delay block 414, so long as a logic inversion does not take place within the delay. Thus, an even number of inverters may be implemented within delay block 414 so as to create an adequately wide pulse width, while refraining from a logic inversion. If sub-buffer delays are required, then other techniques may be used, such as through the use of tunable resistance or capacitance blocks. If inverter blocks are used, then appropriate modulation of the power supply magnitude may also be effective to "tune" the amount of delay generated from each inverter block. Given that delay block 414 is programmable, as discussed in more detail below with respect to FIG. 6, pulse generator 400 adds another dimension to the programmable duty cycle of signal CLK. In particular, the pulse width of signal CLK is dependent upon the amount of delay implemented by delay block 414 while in the pulse mode of operation. Thus, the programmable duty cycle of signal CLK, while in pulse mode, is larger with increased delay and is smaller with reduced delay.

Figure 5:
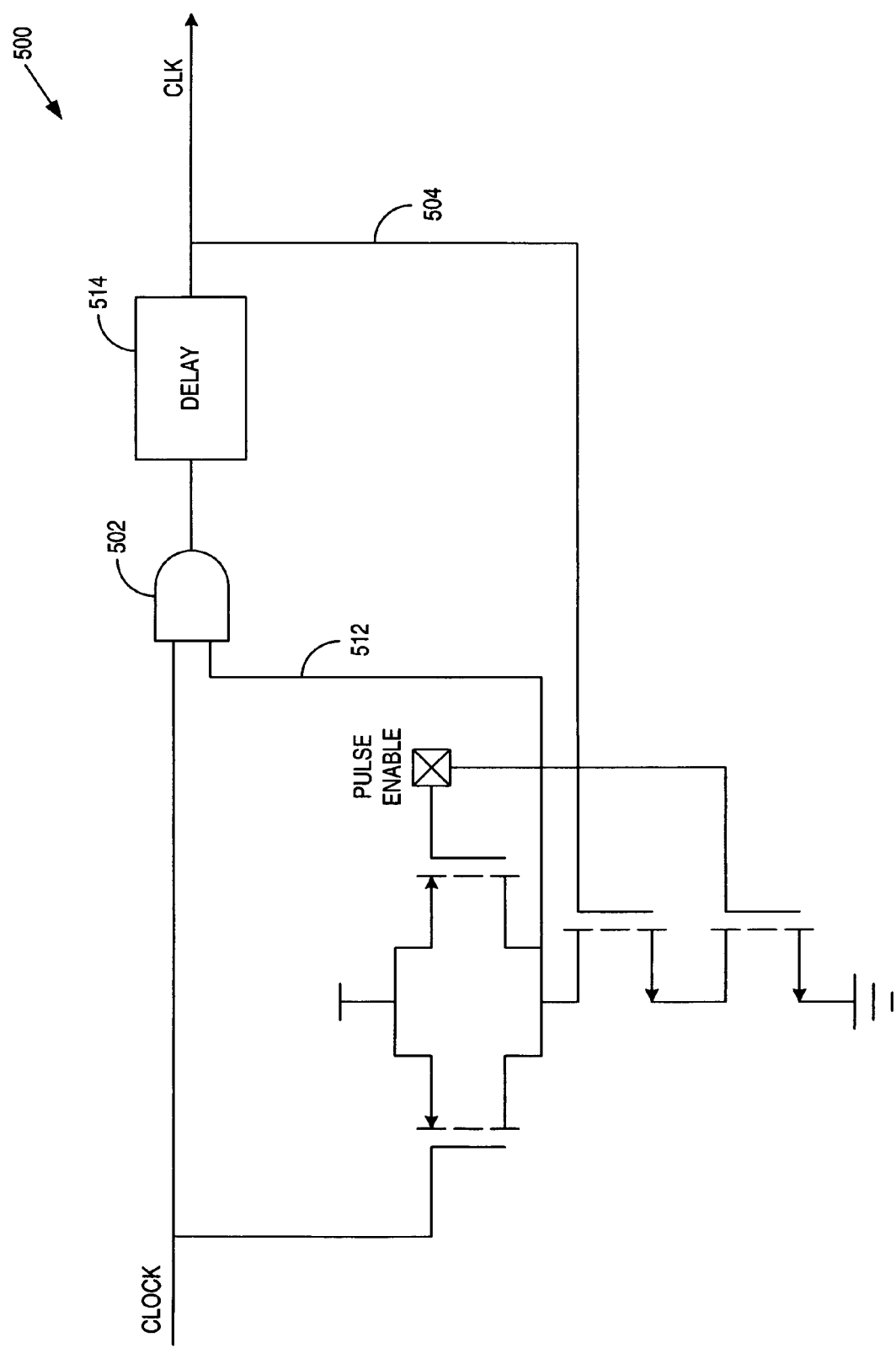
FIG. 5 illustrates an alternative embodiment of the pulse generator of FIG. 1.

Turning to FIG. 5, schematic diagram 500 exemplifies another embodiment of pulse generator 102 of FIG. 1. The operation of pulse generator 500 is essentially identical to that of pulse generator 400, except for the effect of delay block 514. In particular, since delay block 514 is placed between AND gate 502 and the output/feedback node 504, the rising edge of signal CLK is no longer incident with the rising edge of signal CLOCK. Instead, the rising edge of signal CLK is delayed with respect to the rising edge of signal CLOCK by an amount substantially equal to the delay, $\tau_{delay}$, implemented by delay block 514. Furthermore, since the feedback path is also delayed by the same amount of delay, the pulse width remains the same, i.e., approximately equal to the sum of $\tau_{delay}$, the discharge time of node 512, and the propagation delay time through AND gate 502. It can be seen, therefore, that pulse generator 500 similarly provides signal CLK having a programmable duty cycle while in the pulse mode of operation.

Figure 6:
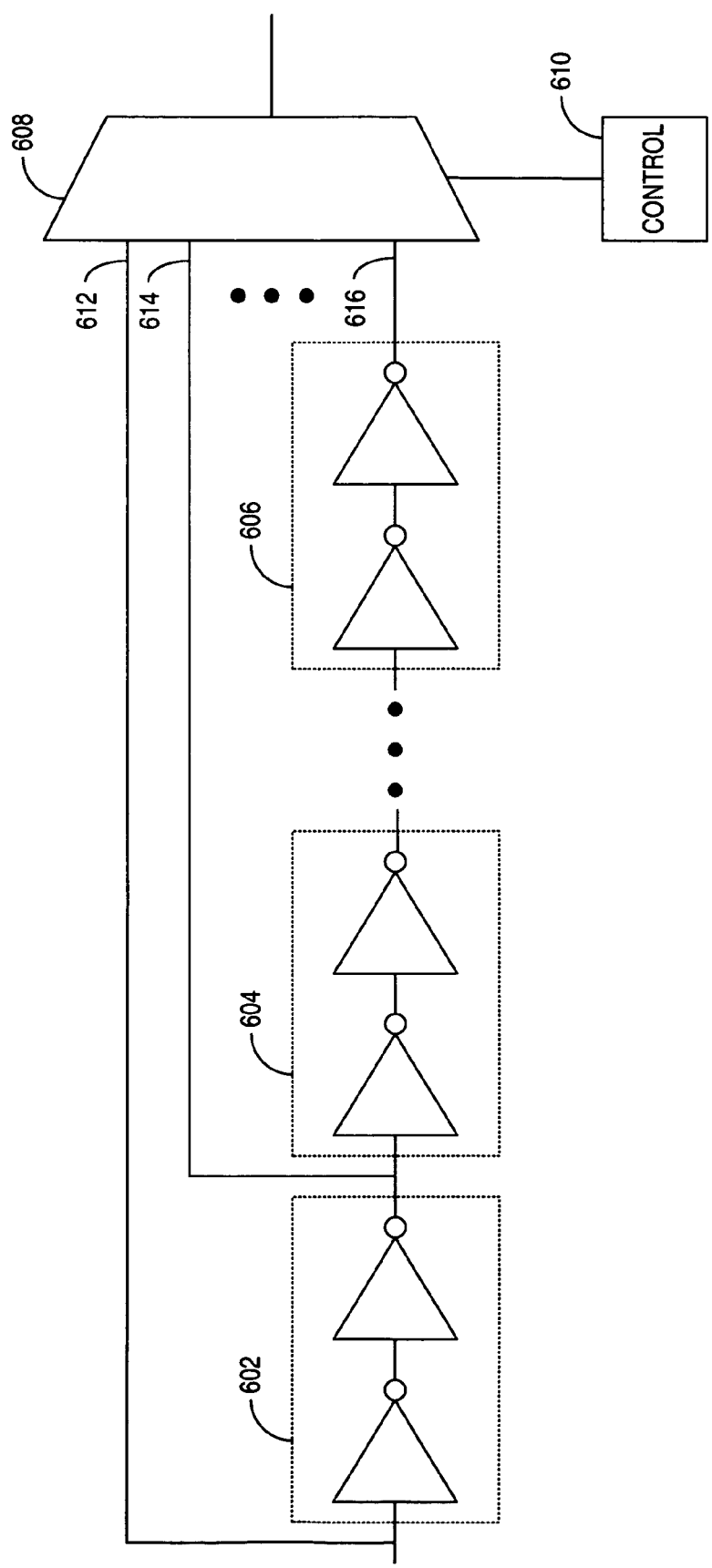
FIG. 6 illustrates an exemplary implementation of the delay blocks used in FIGS. 4 and 5.

In one embodiment, delay blocks 414 and 514 may be implemented as exemplified in FIG. 6, such that the amount of delay implemented may be selected at configuration time via control 610. Delay blocks 602-606 are exemplified as inverter pairs so that logic polarity may be maintained. However, delay blocks 602-606 may also be implemented using other techniques, such as through the use of resistive or capacitive delays, digitally controlled delay lines, etc.

Through operation of multiplexer 608 and control block 610, an appropriate amount of delay may be selected, depending upon which input to the multiplexer is selected. In particular, selection of input 612 results in zero relative delay. Selection of input 614 results in the delay of delay block 602, e.g., $\tau_{602}$. Selection of input 616 results in a delay equal to the sum of delay blocks 602-606, e.g., $\tau_{602}+\tau_{604}+\tau_{606}$, or $N*\tau_{602}$, if delay blocks 602-606 are of equal delay.

Figure 7:
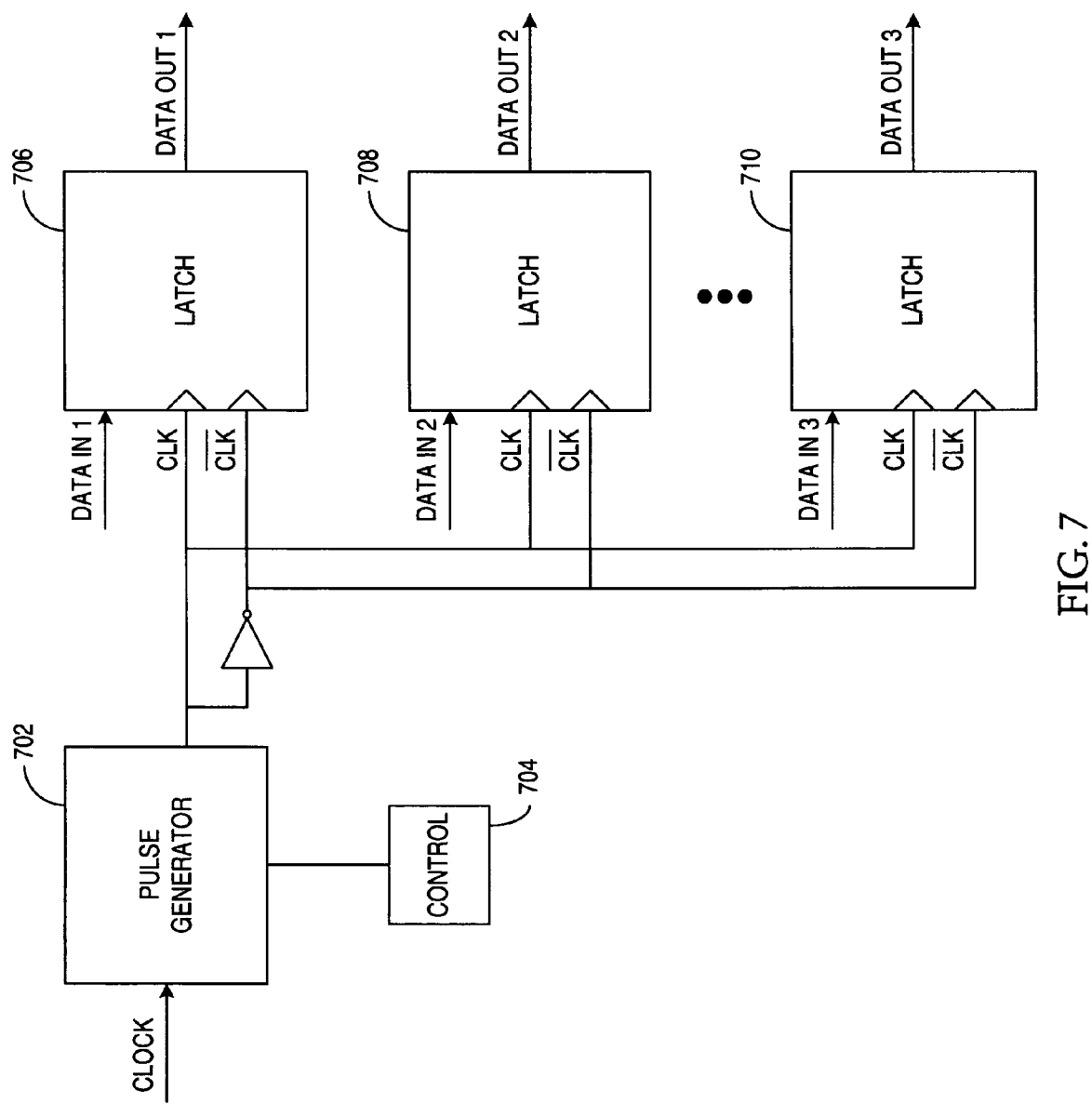
FIG. 7 illustrates an array of configurable latches in accordance with various embodiments of the present invention.

Turning to FIG. 7, an exemplary latch bank block diagram illustrates one embodiment, where a single pulse generator 702 is utilized to program the operation of latches 706-710.

Control 704 is effective to select pulse generator 702 in a clock, or pulse, mode of operation as discussed above in relation to FIG. 1. The pulse generator output signals are fanned out to a bank of latches 706-710, each of which operate in accordance with LS, or ET, functionality as discussed above in relation to FIG. 3.

As discussed above, each of latches 706-710 are implemented using one LS latch as illustrated in FIG. 3. As such, the need to use ET latches is obviated, thus resulting in the ability to implement each of latches 706-710 without a slave stage, as are conventionally associated with ET latches. Thus, for each latch implemented, a savings of one slave stage and associated transmission gating is realized.

Figure 8:
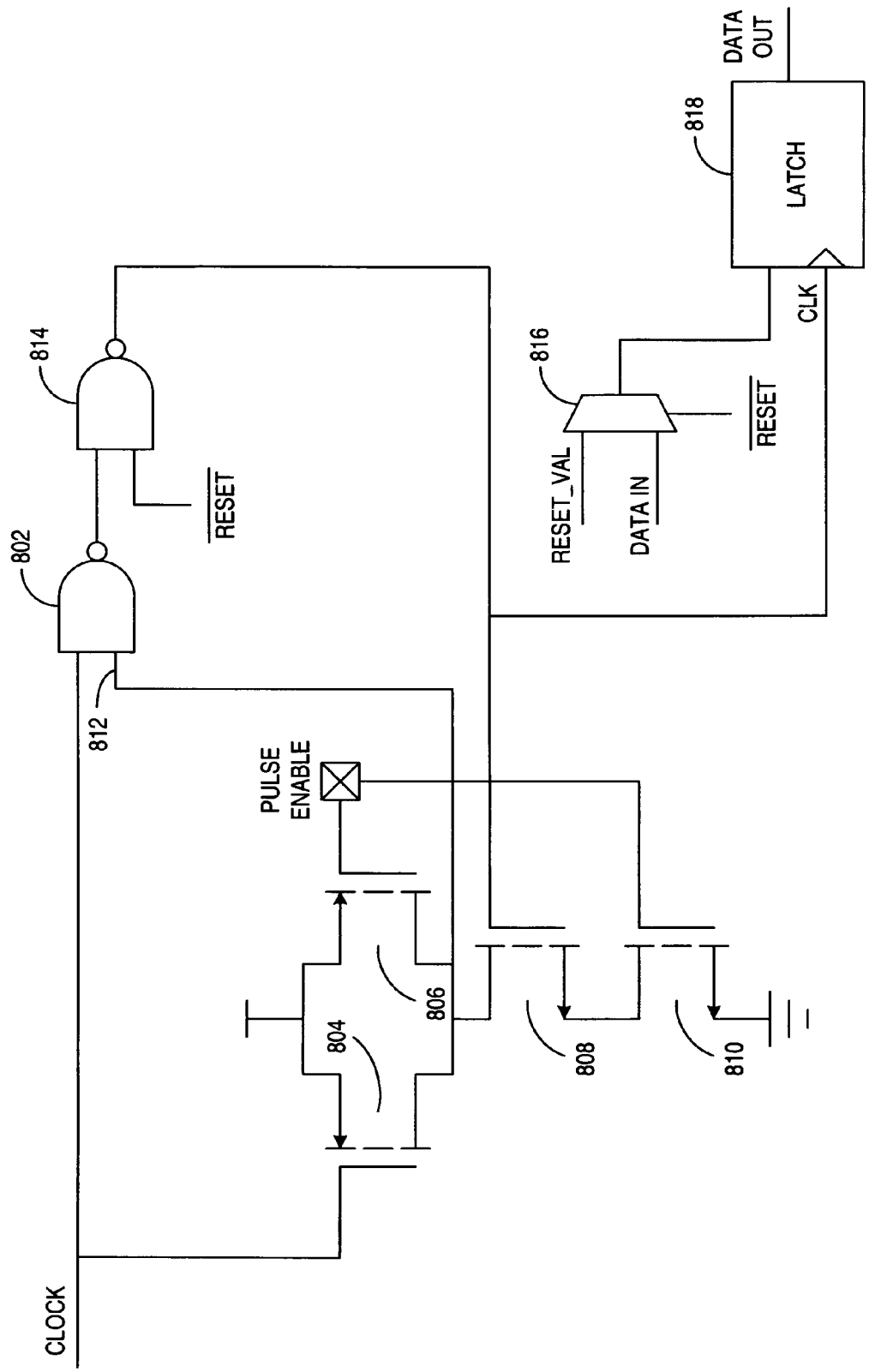
FIG. 8 illustrates an alternative embodiment of a configurable latch.

Turning to FIG. 8, an exemplary schematic diagram of a configurable latch in accordance with various embodiments of the present invention is illustrated, in which reset functionality is incorporated into the pulse generator. The components of the pulse generator of FIG. 8 include components 802-814 and they operate in substantially the same manner as that described for the pulse generator of FIG. 2, except that AND gate 212 of FIG. 2 is replaced with an equivalent cascade of two NAND gates, e.g., NAND gates 802 and 814.

Through the addition of reset capability within the pulse generator of FIG. 8, latch 818 (and the other latches of the bank of latches as shown, for example, in FIG. 7) may also be reset. It can be seen, therefore, that additional savings in semiconductor die area may be realized through obviation of the need for separate reset capability within each latch 818.

Under normal operating conditions, signal $\overline{\text{RESET}}$ is at a logic high level. Thus, the relationship between signals, CLOCK and CLK, operate exactly as discussed above in relation to FIG. 2 under normal operating conditions. In particular, the cascade of NAND gates 802 and 814 as illustrated in FIG. 8 is logically equivalent to the single AND gate 202 of FIG. 2. Signal $\overline{\text{RESET}}$ also serves as the selection control input to multiplexer 816, which selects signal DATA IN under normal operating conditions.

Under a reset condition, signal $\overline{\text{RESET}}$ flips to a logic low level, thus causing multiplexer 816 to select RESET_VAL for the input to latch 818. Signal CLK remains at a logic high level, regardless of the logic level of signal CLOCK, since the output of NAND gate 814 remains at a logic high level as long as one or both of its inputs is at a logic low level. In response, latch 818 operates in a transparent mode, such that any level at the input of latch 818 is asynchronously applied to the output of latch 818, i.e., signal DATA OUT is equal to signal RESET_VAL (ignoring the inversion applied by the LS latch of FIG. 3).

Through operation of multiplexer 816 and signal $\overline{\text{RESET}}$ during the reset condition, signal DATA OUT asynchronously assumes the logic level of signal RESET_VAL. Thus, either a logic low level or a logic high level may be selected for signal DATA OUT through appropriate selection of the logic level for signal RESET_VAL during the reset condition.

Figure 9:
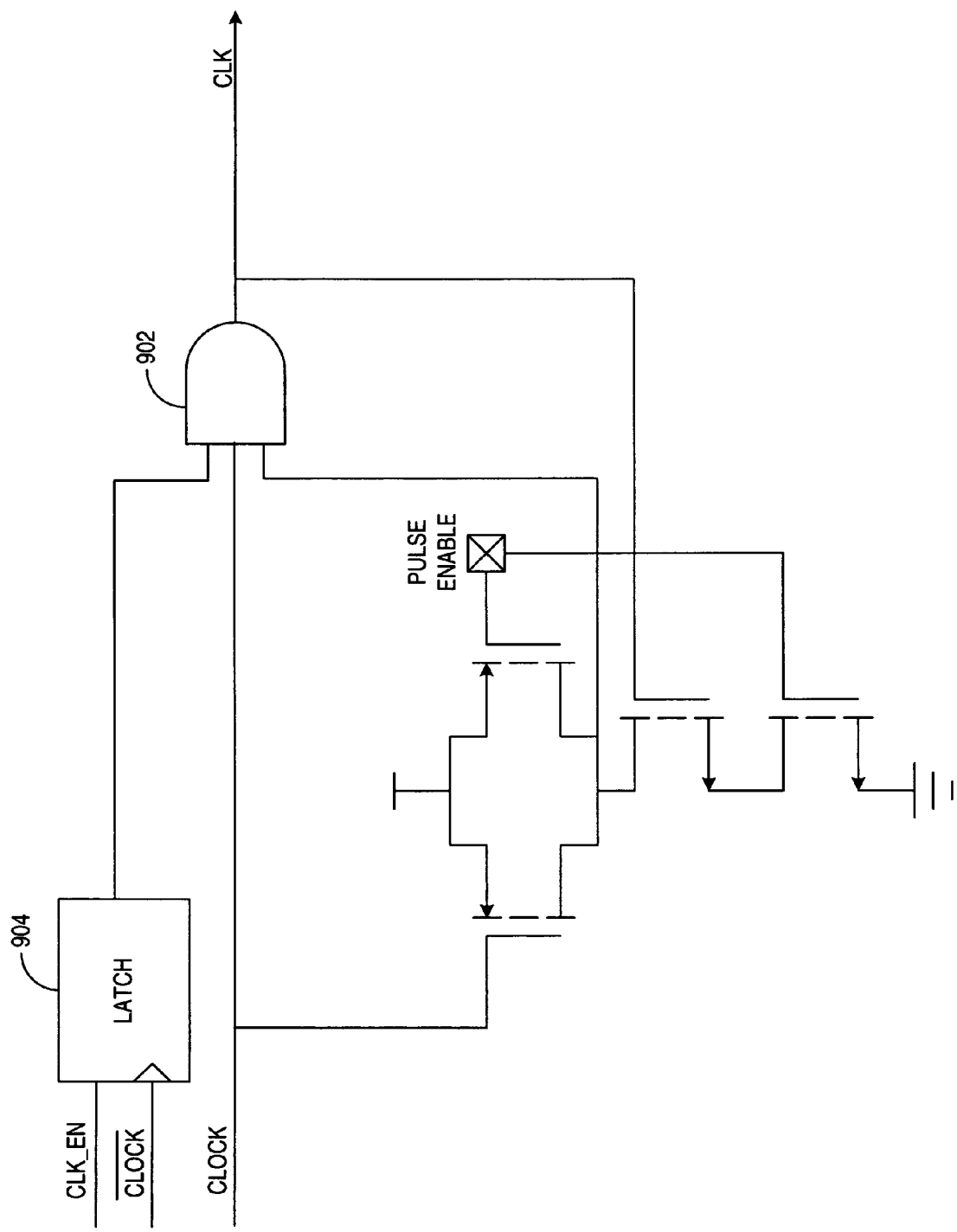
FIG. 9 illustrates yet another alternative embodiment of a configurable latch in accordance with the present invention.

In an alternative embodiment, the pulse generator of FIG. 9 may be enabled through operation of latch 904 and signal CLK_EN. In particular, latch 904 operates as described above in relation to FIG. 3, to provide signal CLK_EN to the third input of AND gate 902. When signal $\overline{\text{CLOCK}}$ is at a logic high level, the logic value of signal CLK_EN is passed through latch 904. When signal CLK_EN is at a logic low level, then the output of AND gate 902 is always at a logic low level, thus disabling signal CLK. When signal CLK_EN is at a logic high level, then AND gate 902 simply operates to buffer signal CLOCK to provide signal CLK in accordance with signal PULSE ENABLE as discussed above.

Latching signal CLK_EN as shown, further prevents the occurrence of glitches. In particular, signal CLK_EN, as presented to AND gate 902, only switches when signal CLK is at a logic low level, thus preventing the occurrence of any condition that may produce short duration pulses at signal CLK. For example, in the event that signal CLK_EN transitions to a logic high level just after the low to high logic transition of signal CLOCK, latch 904 operates as an ET latch to block signal CLK_EN from AND gate 902. As signal CLOCK transitions to a logic low level, signal CLOCK renders latch 904 as an LS latch, thus applying signal CLK_EN to the third input of AND gate 902 synchronously with the falling edge of signal CLOCK.

Figure 10:
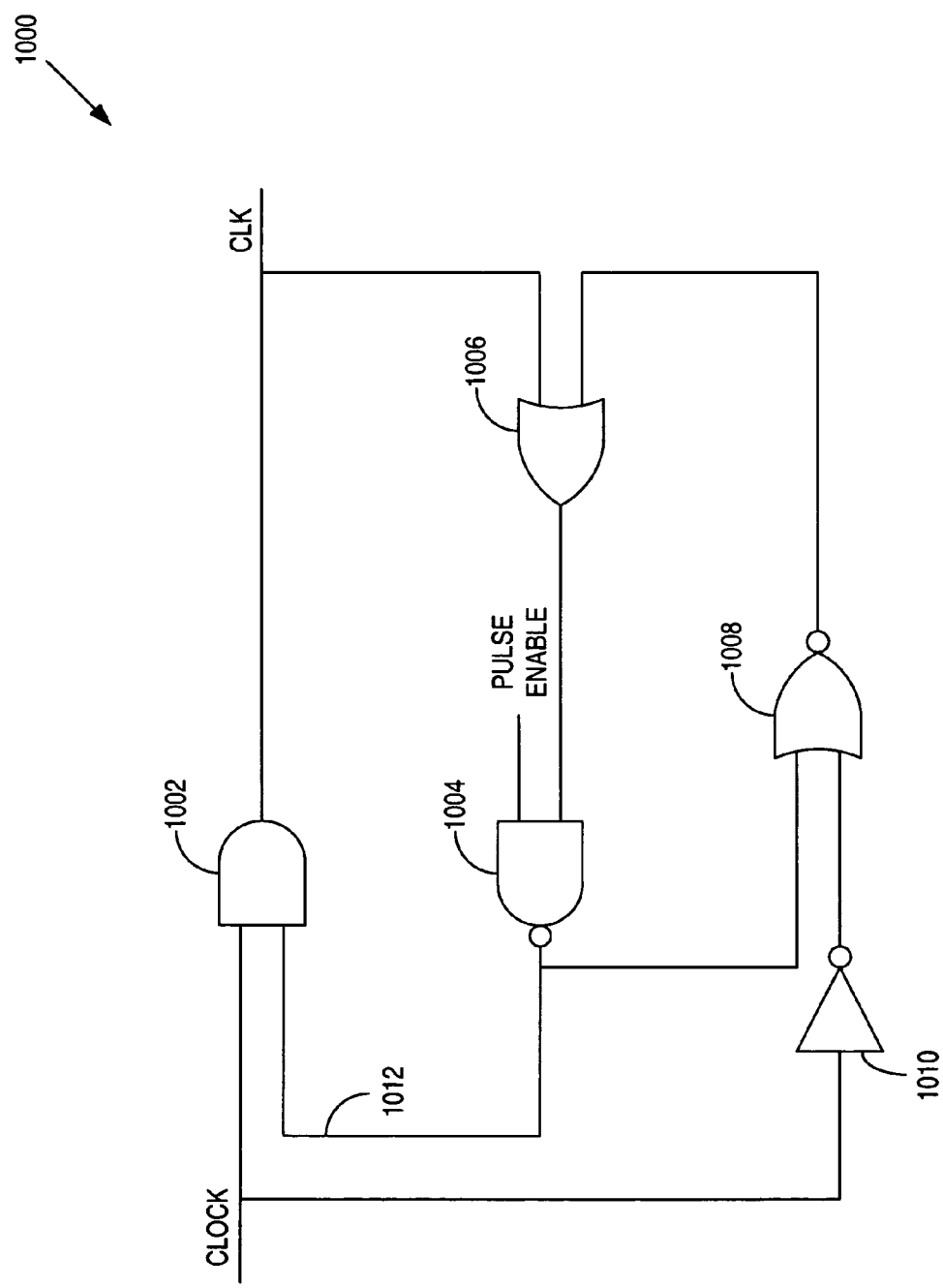
FIG. 10 illustrates an alternative embodiment of the pulse generator of FIG. 1.

Turning to FIG. 10, an alternative embodiment of pulse generator 1000 is shown. Pulse generator 1000 operates in either a clock mode, or a pulse mode, similarly as discussed above in relation to FIG. 2. In pulse mode, signal PULSE ENABLE is at a logic high level. Given that signal CLOCK is at a logic low level, the output of AND gate 1002 (signal CLK) is also at a logic low level. The output of inverter 1010 is at a logic high level, which produces a logic low level at the output of NOR gate 1008. Thus, both inputs of OR gate 1006 are at a logic low level, providing a logic low level to the second input of NAND gate 1004. Since signal PULSE ENABLE is at a logic high level, the output of NAND gate 1004 (node 1012) is also at a logic high level. Thus, in pulse mode, when signal CLOCK is at a logic low level, then signal CLK is also at a logic low level.

Once signal CLOCK transitions from a logic low level to a logic high level, the output of AND gate 1002 (signal CLK) also transitions from a logic low level to a logic high level. The output of OR gate 1006 transitions to a logic high level as well, which causes the output of NAND gate 1004 (node 1012) to transition to a logic low level. Hence, signal CLK transitions from a logic high level to a logic low level, to provide a falling edge of the pulse signal, where the pulse width is substantially equal to the propagation delay of OR gate 1006, NAND gate 1004 and AND gate 1002. A logic low level at node 1012 also causes the output of NOR gate 1008 to transition to a logic high level, which provides feedback to maintain signal CLK at a logic low level, i.e., to prevent glitching of the pulse signal CLK. Once signal CLOCK returns to a logic low level, pulse generator 1000 resets to provide the next pulse whose rising edge is incident to the next rising edge of signal CLOCK, and so on.

In clock mode, signal PULSE ENABLE is at a logic low level, thus providing a logic high level at node 1012. AND gate 1002 simply becomes a buffer for signal CLOCK, such that signal CLOCK is passed to signal CLK during clock mode of operation.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A configurable latch, comprising:

a pulse generator coupled to receive a clock input signal and a pulse mode signal, the pulse generator adapted to provide a clock output signal having a programmable duty cycle in response to a logic level of the pulse mode signal; and a level sensitive (LS) latch coupled to receive the clock output signal, the LS latch adapted to operate as an edge triggered (ET) latch in response to a first duty cycle of the clock output signal and adapted to operate as an LS latch in response to a second duty cycle of the clock output signal, wherein the pulse generator comprises a reset circuit coupled to receive a reset value and a reset signal and adapted to drive an output of the LS latch to the reset value in response to a first state of the reset signal.

2. The configurable latch of claim 1, wherein the pulse generator comprises a first transistor pair having a pair of first conductors coupled to a first node, a first control terminal coupled to receive the clock input signal, and a second control terminal coupled to receive the pulse mode signal.

3. The configurable latch of claim 2, wherein the pulse generator further comprises a second transistor pair having commonly coupled first conductors, a third control terminal coupled to receive the pulse mode signal, and a fourth control terminal coupled to receive the clock output signal.

4. The configurable latch of claim 3, wherein the pulse generator further comprises a logic gate having a first input coupled to receive the clock input signal, a second input coupled to the first node, and an output coupled to provide the clock output signal.

5. The configurable latch of claim 4, wherein the pulse generator further comprises a delay block coupled between the output of the logic gate and the fourth control terminal and adapted to increase the first duty cycle.

6. The configurable latch of claim 4, further comprising a second latch coupled to receive a clock enable signal, the second latch being adapted to provide the clock enable signal to the logic gate in synchronization with a logic low value of the clock input signal, wherein the logic gate passes the clock input signal in response to a first level of the clock enable signal and blocks the clock input signal in response to a second level of the clock enable signal.

7. The configurable latch of claim 1, wherein the pulse generator comprises a first logic gate coupled to receive the clock input signal at a first input and a clock gating signal at a second input, wherein the first logic gate passes the clock input signal in response to a first level of the clock gating signal and blocks the clock input signal in response to a second level of the clock gating signal.

8. The configurable latch of claim 7, wherein the pulse generator further comprises a second logic gate coupled to receive the pulse mode signal at a first input and coupled to receive the clock output signal at a second input and adapted to provide the second level of the clock gating signal in response to a logic high level of the clock output signal and a logic high level of the pulse mode signal.

9. A configurable latch bank, comprising:

a pulse generator coupled to receive a clock signal, the pulse generator adapted to pass the clock signal in response to a signal that indicates a clock mode of operation and adapted to generate a variable width pulse signal from the clock signal in response to a signal that indicates a pulse mode of operation; and a plurality of level sensitive (LS) latches coupled to the pulse generator and adapted to operate as LS latches in response to receiving the clock signal and adapted to operate as edge triggered (ET) latches in response to receiving the variable width pulse signal, the pulse generator including, a reset circuit coupled to receive a reset signal and a corresponding reset value for each of the plurality of LS latches, the reset circuit adapted to drive an output of each of the plurality of LS latches to the corresponding reset value in response to a first state of the reset signal.

10. The configurable latch bank of claim 9, wherein the pulse generator further comprises a logic gate coupled to receive the clock signal and a gating signal and adapted to provide the clock signal in response to a first level of the gating signal and adapted to block the clock signal in response to a second level of gating signal.

11. The configurable latch bank of claim 10, wherein the pulse generator further comprises a gating circuit coupled to the logic gate and adapted to provide the gating signal.

12. The configurable latch bank of claim 11, wherein the gating circuit comprises a first transistor pair coupled to receive a pulse mode signal and adapted to generate the first level of the gating signal in response to a first level of the pulse mode signal.

13. The configurable latch bank of claim 12, wherein the gating circuit further comprises a second transistor pair coupled to receive the pulse mode signal and adapted to generate the second level of the gating signal in response to a second level of the pulse mode signal.

14. The configurable latch bank of claim 13, wherein the reset circuit comprises a plurality of multiplexers, each one of the plurality of multiplexers being coupled to a corresponding one of the plurality of LS latches, each multiplexer coupled to receive the corresponding reset value at a first input and adapted to provide the corresponding reset value to the corresponding LS latch in response to the first state of the reset signal.

15. The configurable latch bank of claim 10, wherein the pulse generator further comprises a clock enable circuit coupled to receive a clock enable signal and adapted to disable an output of the logic gate in response to a first level of the clock enable signal; wherein the output of the logic gate is disabled only when the clock signal is at a logic low level.

16. A configurable latch, comprising:
a pulse generator coupled to receive a clock input signal and a pulse mode signal, the pulse generator adapted to provide a clock output signal having a programmable duty cycle in response to a logic level of the pulse mode signal; and
a level sensitive (LS) latch coupled to receive the clock output signal, the LS latch adapted to operate as an edge triggered (ET) latch in response to a first duty cycle of the clock output signal and adapted to operate as an LS latch in response to a second duty cycle of the clock output signal,
wherein the pulse generator comprises a first logic gate coupled to receive the clock input signal at a first input and a clock gating signal at a second input, wherein the first logic gate passes the clock input signal in response to a first level of the clock gating signal and blocks the clock input signal in response to a second level of the clock gating signal, and
wherein the pulse generator further comprises a second logic gate coupled to receive the pulse mode signal at a first input and coupled to receive the clock output signal at a second input and adapted to provide the second level of the clock gating signal in response to a logic high level of the clock output signal and a logic high level of the pulse mode signal.

17. The configurable latch of claim 16, wherein the pulse generator further comprises a delay block coupled between an output of the first logic gate and the clock output signal.

18. The configurable latch of claim 16, further comprising a second latch coupled to receive a clock enable signal, the second latch being adapted to provide the clock enable signal to the first logic gate in synchronization with a logic low value of the clock input signal, wherein the first logic gate passes the clock input signal in response to a first level of the clock enable signal and blocks the clock input signal in response to a second level of the clock enable signal.

* * * * *